US 8,260,212 B2

(12) United States Patent
Chien

(10) Patent No.: US 8,260,212 B2
(45) Date of Patent: Sep. 4, 2012

(54) METHOD AND SYSTEM FOR A RECONFIGURABLE FILTER THAT IS UTILIZED BY A RF TRANSMITTER AND A RF RECEIVER WHICH ARE INTEGRATED ON A SINGLE SUBSTRATE

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 572 days.

(21) Appl. No.: 12/468,431

(22) Filed: May 19, 2009

(65) Prior Publication Data

US 2010/0297961 A1    Nov. 25, 2010

(51) Int. Cl.
*H04B 1/40* (2006.01)
(52) U.S. Cl. ............................................. 455/73; 455/84
(58) Field of Classification Search .................... 455/73, 455/84
See application file for complete search history.

(56) References Cited

U.S. PATENT DOCUMENTS

| 5,701,594 A * | 12/1997 | Bath et al. .................... 455/78 |
| 7,257,380 B2 * | 8/2007 | Darabi et al. .................... 455/73 |
| 2001/0038322 A1 * | 11/2001 | Komazaki et al. ............. 333/133 |
| 2002/0142733 A1 * | 10/2002 | Nishinakagawa ............... 455/84 |

* cited by examiner

*Primary Examiner* — Joseph Chang
(74) *Attorney, Agent, or Firm* — Sterne, Kessler, Goldstein & Fox PLLC

(57) ABSTRACT

An RF receiver and an RF transmitter, which are integrated in a single substrate, are operable to share a single reconfigurable filter to perform RF receiver filtering and RF transmitter filtering. The reconfigurable filter is configured to operate as a bandpass filter such as an image rejection bandpass filter for receiving RF signals by the RF receiver. The reconfigurable filter operates as a low pass filter for transmitting RF signals by the RF transmitter. The reconfigurable filter is configured to operate in a RF receiver filtering mode or a RF transmitter filtering mode, respectively. The reconfigurable filter is enabled to share configurable circuit components of the radio transceiver in both the radio frequency receiver filtering mode and the radio frequency transmitter filtering mode. The reconfigurable filter transitions between the radio frequency receiver filtering mode and the radio frequency transmitter filtering mode via reconfiguring the shared configurable circuit components.

21 Claims, 6 Drawing Sheets

METHOD AND SYSTEM FOR A RECONFIGURABLE FILTER THAT IS UTILIZED BY A RF TRANSMITTER AND A RF RECEIVER WHICH ARE INTEGRATED ON A SINGLE SUBSTRATE

CROSS-REFERENCE TO RELATED APPLICATIONS/INCORPORATION BY REFERENCE

Not applicable.

FIELD OF THE INVENTION

Certain embodiments of the invention relate to communication systems. More specifically, certain embodiments of the invention relate to a method and system for a reconfigurable filter that is utilized by a RF transmitter and a RF receiver which are integrated on a single substrate.

BACKGROUND OF THE INVENTION

Signals are transmitted at radio frequencies (RF) in various ways such as using terrestrial, cable, or satellite transmission schemes. Some Radio Frequency (RF) receiver design convert high frequency RF signals to one or more Intermediate Frequencies (IF) which, in a final translation step, are converted to baseband or Direct Current (DC). Such IF signals are by nature at a lower frequency than the RF signals. The reverse conversion is effected at the Radio Frequency (RF) transmitter. In a typical radio frequency transceiver (RF transmitter and RF receiver) that is implemented on a chip, a RF receiver circuit is separated from a RF transmitter circuit. For example, with an active RC implementation, the RF receiver circuit normally uses a mixer and a poly-phase image rejection band pass filter for each signal translation stage, while a mixer and a low pass filter are used in the RF transmitter circuit. Both the RF receiver circuit and the RF transmitter circuit may occupy large area on the chip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a reconfigurable filter that is utilized by a RF transmitter and a RF receiver which are integrated on a single substrate, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a reconfigurable filter that is utilized by a RF transmitter and a RF receiver which are integrated on a single substrate. In accordance with various embodiments of the invention, a RF receiver and a RF transmitter are integrated on a single substrate. A RF front end of the RF receiver and a RF front end of the RF transmitter may be enabled to share a single reconfigurable filter to perform a RF receiver filtering operation and a RF transmitter filtering operation. The reconfigurable filter may be enabled to operate as a bandpass filter such as an image rejection bandpass filter for receiving RF signals by the RF receiver. The reconfigurable filter may be enabled to operate as a low pass filter for transmitting RF signals by the RF transmitter. The reconfigurable filter may be enabled to operate in a radio frequency receiver filtering mode or a radio frequency transmitter filtering mode, respectively. The reconfigurable filter may be enabled to share configurable circuit components on the single substrate in the radio frequency receiver filtering mode and the radio frequency transmitter filtering mode. The reconfigurable filter may enable transition between the radio frequency receiver filtering mode and the radio frequency transmitter filtering mode by tuning the shared configurable circuit components. For example, the reconfigurable filter may be enabled to operate in the radio frequency receiver filtering mode or the radio frequency transmitter filtering mode by adjusting the value of programmable resistors on the single substrate. In addition, the reconfigurable filter may enable transition between the radio frequency receiver filtering mode and the radio frequency transmitter filtering mode via activating or deactivating the shared configurable circuit components such as circuit switches on the single substrate.

Figure 1A:
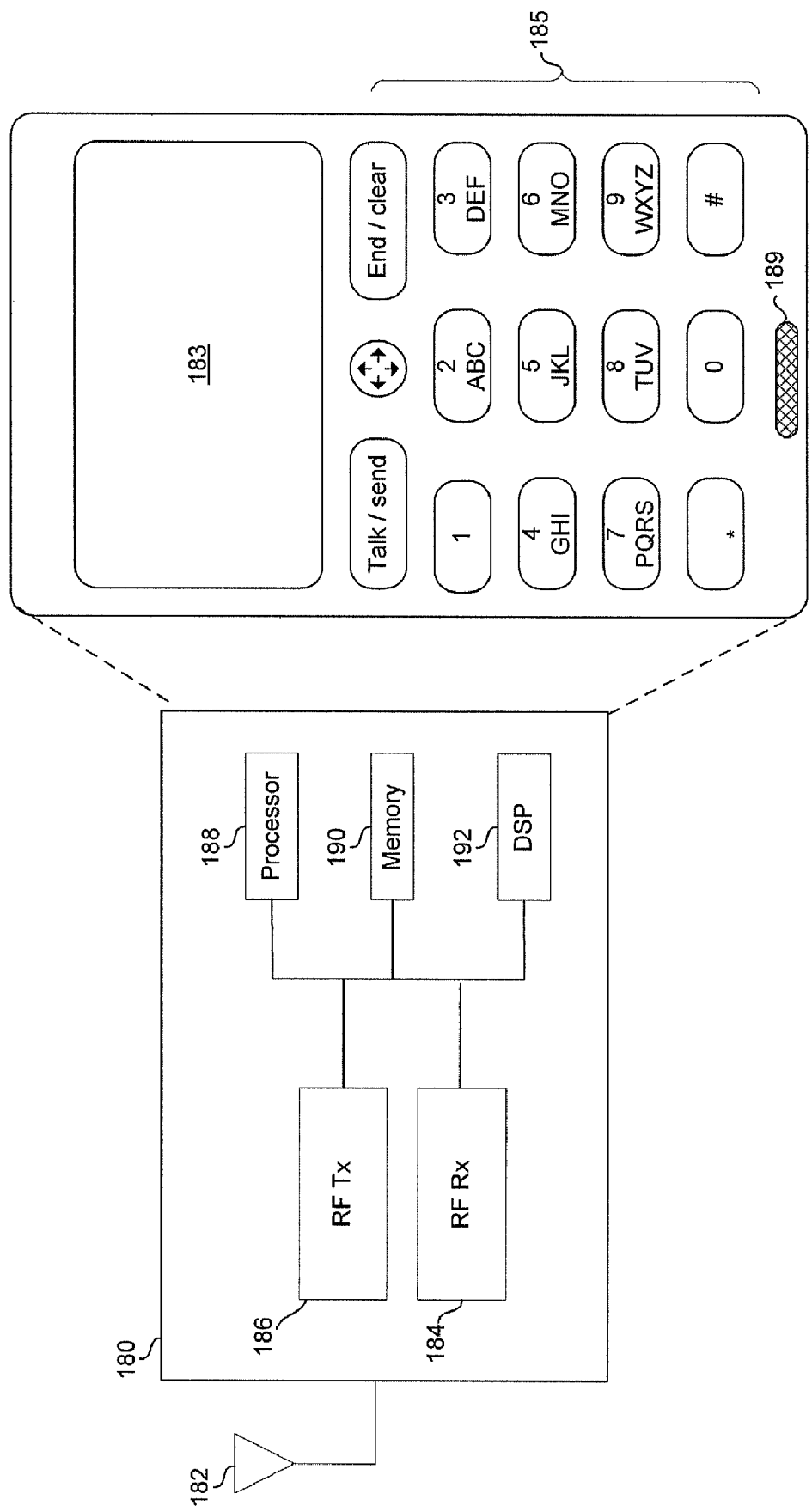
FIG. 1A is a block diagram of an exemplary communication device that utilizes a combined receiver poly-phase band pass filter and transmitter low pass filter in a radio frequency (RF) transceiver, in accordance with an embodiment of the invention.

FIG. 1A is a block diagram of an exemplary communication device that utilizes a combined receiver poly-phase band pass filter and transmitter low pass filter in a radio frequency (RF) transceiver, in accordance with an embodiment of the invention. Referring to FIG. 1A, there is shown a communication device 180 comprising an antenna 182, a radio frequency (RF) receiver (Rx) 184, a radio frequency (RF) transmitter (Tx) 186, a processor 188, a memory 190, a DSP 192, a display 183, user controls 185, a speaker 187, and a microphone 189.

The antenna 182 may be suitable for transmitting and/or receiving electromagnetic signals. Although a single antenna is illustrated, the invention is not so limited. In this regard, the RF Tx/Rx 184 may utilize a common antenna for transmission and reception of signals adhering to one or more wireless standards, may utilize different antennas for each supported wireless standard, and/or may utilize a plurality of antennas for each supported wireless standard.

The RF Rx 184 may comprise suitable logic circuitry and/or code that may be operable to receive data utilizing one or more wired, wireless, and/or optical standards. In various exemplary embodiments of the invention, the RF Rx 184 may be operable to communicate in adherence with cellular, WiMAX, Wi-Fi, Bluetooth, Zigbee, T1/E1, Ethernet, USB, IEEE 1394, analog audio standards, analog video standards, digital audio standards, and/or digital video standards. The radio RF Rx 184 may be operable to perform amplification, down-conversion, filtering, demodulation, and analog to digital conversion of received signals. Various receiver bandpass filters such as a receiver poly-phase band pass filter may be utilized in the RF Rx 184. The receiver bandpass filters may be enabled to receive inbound RF signals received by the antenna 182. In this regard, the receiver poly-phase band pass filter may be realized by sharing various circuit components such as, for example, resistors and/or capacitors, with the RF Tx 186 to reduce chip area and/or power consumption.

The RF Tx 186 may comprise suitable logic circuitry and/or code that may be operable to transmit data utilizing one or more wired, wireless, and/or optical standards. In various exemplary embodiments of the invention, the RF Tx 186 may be operable to communicate in adherence with cellular, WiMAX, Wi-Fi, Bluetooth, Zigbee, T1/E1, Ethernet, USB, IEEE 1394, analog audio standards, analog video standards, digital audio standards, and/or digital video standards. The radio RF Tx 186 may be operable to perform amplification, up-conversion, filtering, modulation, and digital to analog conversion of signals to be transmitted. Various transmitter lowpass filters such as a Wiener filter may be utilized in the RF Tx 186. The lowpass filters may be enabled to suppress intermediate frequency spurs on the signals to be transmitted. In this regard, a transmitter lowpass filter may be implemented by sharing various circuit components such as, for example, resistors and/or capacitors, with the RF Rx 184 to reduce chip area and/or power consumption.

The processor 188 may comprise suitable logic, circuitry, and/or code that may enable processing data and/or controlling operations of the communication device 180. In this regard, the processor 188 may be enabled to provide control signals to the various other portions comprising the communication device 180. The processor 188 may also control transfers of data between various portions of the communication device 180. Additionally, the processor 188 may enable execution of applications programs and/or code for processing data and effectuating operation of the communication device 180.

The memory 190 may comprise suitable logic, circuitry, and/or code that may enable storage or programming of information comprising parameters and/or code that may effectuate the operation of the communication device 180. Stored information may comprise received data and/or data to be presented, transmitted, and/or otherwise processed. The parameters may comprise configuration data and the code may comprise operational code such as software and/or firmware, but the information need not be limited in this regard.

The DSP 192 may comprise suitable logic, circuitry, and/or code operable to perform computationally intensive processing of data. In various embodiments of the invention, the DSP 192 may encode, decode, transcode, modulate, demodulate, encrypt, decrypt, scramble, descramble, and/or otherwise process data.

The display 183 may be operable to provide visual information to, and/or enable interaction by, a user of the communication device 180. In various embodiments of the invention, a graphical user interface may be presented via the display 183. In various embodiments of the invention, a visual media content such as video, images, and text may be presented via the display 183.

The user controls 185 may be operable to enable user interaction with the communication device 180 to control services and/or content handled by the communication device 180. The user controls 185 may comprise, for example, a keypad, a keyboard, a roller ball, a multidirectional button, a scroll wheels, and/or a touch screen.

The speaker 187 may be operable to present audio information to a user. The speaker may present voice from a phone call and/or music or ringtones played back by the cellular enabled communication device.

The microphone 189 may be operable to convert acoustic signals into electronic signals. The microphone may enable a user to participate in a phone call and/or interact with the cellular enabled communication device via oral input.

In an exemplary operation, the RF Tx 186 may be enabled to process digital baseband data, and output to the processor 188, the memory 190, and/or the DSP 192. The digital baseband data may be processed by the processor 188, the memory 190, and/or the DSP 192 to be transmitted to a target receiver. In this regard, a lowpass filter may be utilized within the RF Tx 186. The lowpass filter may be implemented by sharing circuit components with the RF Rx 184 and the RF Tx 186 to reduce chip area and/or power consumption.

In another exemplary operation, the RF Rx 184 may receive data formatted according to one or more communication standards, process the data, and output digital baseband data to the processor 188, the memory 190, and/or the DSP 192. The digital baseband data may be processed by the processor 188, the memory 190, and/or the DSP 192 to effectuate operation of the communication device 180 and/or for presentation of content to a user of the communication device 180. In this regard, a bandpass filter may be utilized within the RF Rx 184. The bandpass filter may be implemented by sharing circuit components with the RF Rx 184 and the RF Tx 186 to reduce chip area and/or power consumption.

Figure 1B:
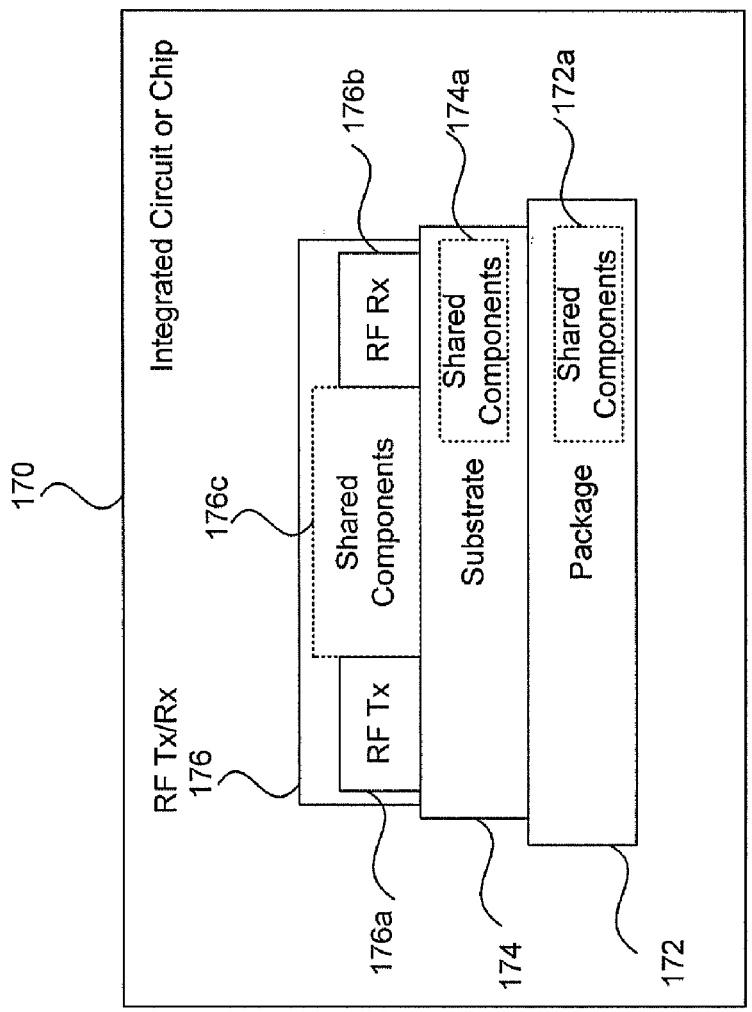
FIG. 1B is a block diagram of an exemplary layout of a RF transmitter and a RF receiver which are integrated on a single substrate, in accordance with an embodiment of the invention.

FIG. 1B is a block diagram of an exemplary layout of a RF transmitter and a RF receiver which are integrated on a single substrate, in accordance with an embodiment of the invention. Referring to FIG. 1B, there is shown an integrated circuit or chip 170. The integrated circuit or chip 170 may comprise a package layer 172, a substrate layer 174, and a RF Tx/Rx layer 176, respectively.

The package layer 172 may comprise a plurality of circuit components such as capacitors, resistors, inductors, and/or switches. At least a portion of the plurality of circuit components of package layer 172 may be shared for transmitting and/or receiving RF signals. In this regard, the shared components 172a of the package layer 172 may be configurable circuit components to be utilized for receiver bandpass filtering and transmitter lowpass filtering, respectively.

The substrate layer 174 may be designed with a p-type substrate and/or an n-type substrate. The plurality of circuit components of the package layer 172 may be assembled onto to the substrate layer 174 to form an extremely compact, highly integrated, multi-component package or system-in-package. In this regard, at least a portion of the assembled circuit components of the package layer 172 may be shared for transmitting and/or receiving RF signals. In this regard, the shared components 174a of the substrate layer 174 may be configurable to perform receiver bandpass filtering and transmitter lowpass filtering, respectively.

The RF Tx/Rx layer 176 may comprise an integrated radio circuit on the substrate layer 174. The Tx/Rx layer 176 may comprise a RF Tx 176a and a RF Rx 176b. The RF Tx 176a may be operable to perform various RF signal transmission functions such as, for example, amplification, up-conversion, filtering, modulation, and digital to analog conversion of signals to be transmitted. The RF Rx 176b may be operable to perform various RF signal receiving functions such as, for example, amplification, down-conversion, filtering, demodulation, and analog to digital conversion of signals to be received. In this regard, filtering operations in the RF Rx 176b and the RF Tx 176a may be implemented by sharing at least a portion of the integrated radio circuit on the substrate layer 174 to reduce chip area and/or power consumption. In this regard, the shared components 176c may be configurable to perform receiver bandpass filtering and transmitter lowpass filtering, respectively.

Figure 2:
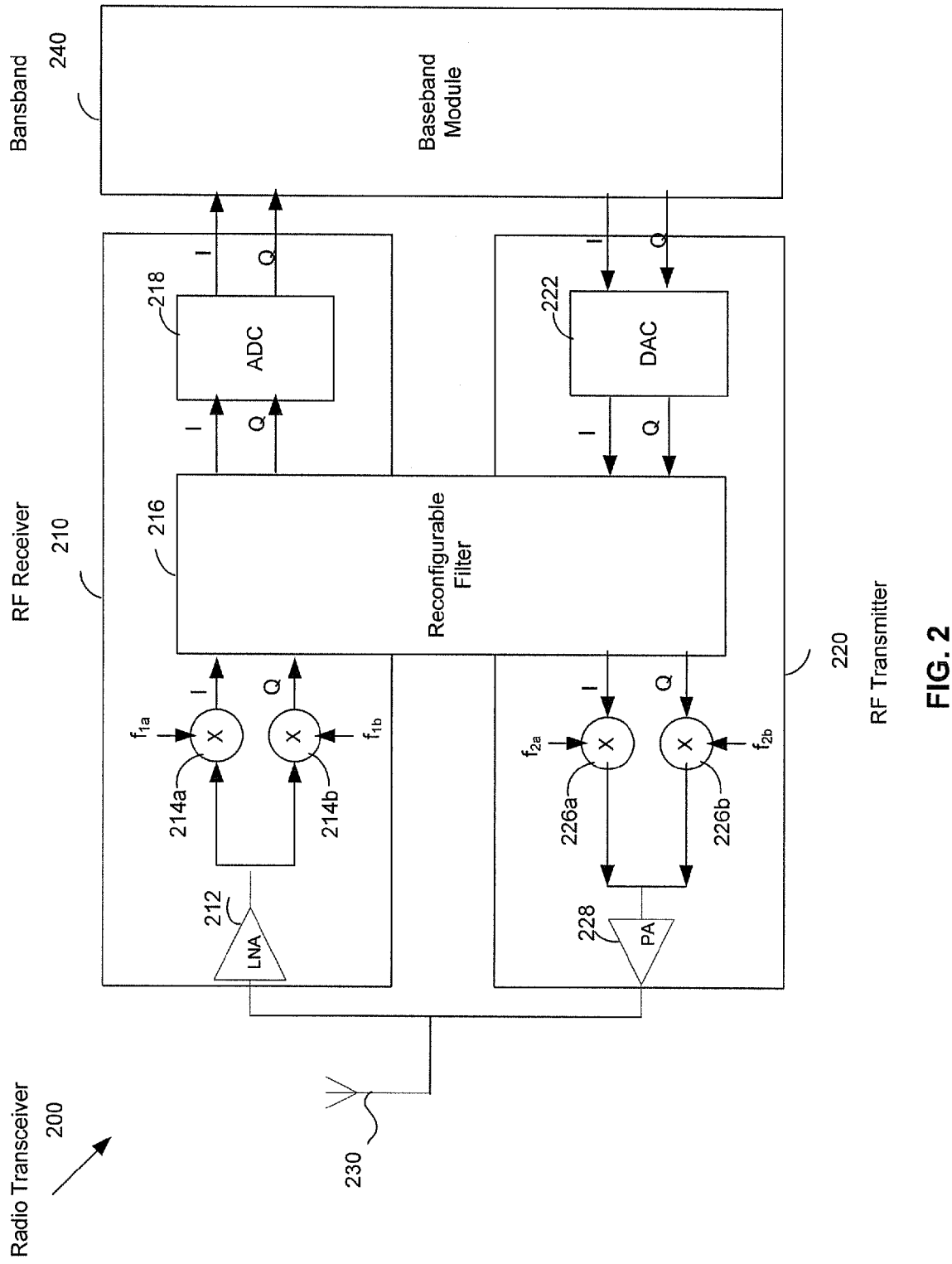
FIG. 2 is a diagram illustrating a radio transceiver that is enabled to combine receiver poly-phase band pass filter with transmitter low pass filter via programmable resistors and switches, in accordance with an embodiment of the invention.

FIG. 2 is a diagram illustrating a radio transceiver that utilizes a combined receiver poly-phase band pass filter and transmitter low pass filter, in accordance with an embodiment of the invention. Referring to FIG. 2, there is shown a radio transceiver 200 comprising a RF receiver 210, a RF transmitter 220, antenna 230, and a baseband module 240. The RF receiver 210 comprises a low noise amplifier (LNA) 212, mixers 214a and 214b, and an analog-to-digital converter (ADC) 218. The RF transmitter 220 comprises a digital-to-analog converter (DAC) 222, mixers 126a and 126b, and an operational amplifier (OP) 228. In the RF transceiver 200 of FIG. 2, a shared reconfigurable filter 216 is shared by both the RF receiver 210 and the RF transmitter 220, respectively.

The RF receiver 210 may comprise suitable logic, circuitry, and/or code that may be operable to process inbound RF signals received via the antenna 230. The RF receiver 210 may enable conversion of the received RF signal to a baseband frequency signal to be processed by the baseband module 240.

The LNA 212 may comprise suitable logic, circuitry and/or code that may be operable to amplify an inbound RF signal from the antenna 230. The LNA 212 may be configured to essentially set a limit for how low a system noise figure may reach. The LNA 212 may be enabled to achieve a low noise performance, which is crucial for a high performance radio frequency (RF) front end.

The mixers 214a and 214b may comprise suitable logic, circuitry and/or code that may be operable to multiply the amplified inbound RF signal from the LNA 212 with a pair of downconversion signals ($f_{1a}$, $f_{1b}$). The pair of downconversion signals ($f_{1a}$, $f_{1b}$) may have the same frequency but a 90 degree phase difference with respect to one another. The amplified inbound RF signal from the LNA 212 may be communicated with the shared reconfigurable filter 216 to perform receiver bandpass filtering over a real (I) path via the mixer 214a and an imaginary (Q) path via the mixer 214b, respectively.

The ADC 218 may comprise suitable logic, circuitry and/or code that may be operable to convert received analog signals from the shared reconfigurable filter 216 to a series of digital data (e.g., bytes) having values representative of the signal amplitude. The digital data may be communicated with the baseband module 240 for further baseband processing.

The RF transmitter 220 may comprise suitable logic, circuitry, and/or code that may be operable to process a digital baseband signal received over I path and Q path from the baseband module 240 for transmission. The RF transmitter 220 may be enabled to perform direct upconversion of the received digital baseband signal into a designated frequency band signal and transmit via the antenna 230.

The DAC 222 may comprise suitable logic, circuitry and/or code that may be operable to convert the received digital baseband signal to a baseband analog signal. The DAC 222 may be enabled to communicate the baseband analog signal with the shared reconfigurable filter 216 to perform transmitter lowpass filtering over I path and Q path, respectively.

The mixers 226a and 226b may comprise suitable logic, circuitry and/or code that may be operable to multiply the low pass filtered signals from the shared reconfigurable filter 216 with a pair of upconversion signals ($f_{2a}$, $f_{2b}$). The pair of upconversion signals ($f_{2a}$, $f_{2b}$) may have the same frequency and a 90 degree phase difference with respect to one another. The outputs of the mixer 226a and the mixer 226b may be communicated with the operational amplifier (OP) 226.

The OP 226 may comprise suitable logic, circuitry and/or code that may be enabled to amplify signals from the mixers 226a and 226b, respectively.

The antenna 230 may comprise suitable logic, circuitry and/or code that may be operable to receive and transmit signals in radio frequency (RF) bands. Although the single antenna 230 is illustrated in FIG. 2, the invention may not be so limited. Accordingly, one or more antennas may be utilized for receiving and/or transmitting signals in radio frequency (RF) bands by the radio transceiver 200 without departing from the spirit and scope of various embodiments of the invention.

The baseband module 240 may comprise suitable logic, circuitry and/or code that may be operable to process digitized baseband signals. In the event that the digitized baseband signals may be from the ADC 218 of the RF receiver 210, the baseband module 240 may be enabled to extract information conveyed in an associated inbound RF signal. The baseband module 240 may be enabled to perform such operations as demodulation, decorrelation, decoding, and error correction. In the event that the digitized baseband signals may need to be transmitted, the baseband module 240 may be enabled to communicate with the RF transmitter 220 to transmit corresponding signals via the antenna 230.

The shared reconfigurable filter 216 may comprise suitable logic, circuitry and/or code that may be configured to perform various RF filtering operations such as, for example, low pass filtering, band pass filtering, and/or high pass filtering. In this regard, the shared reconfigurable filter 216 may be enabled to operate for a RF receiver bandpass filtering and/or for a RF transmitter lowpass filtering. The shared reconfigurable filter 216 may be configured to combine the RF receiver bandpass filtering and the RF transmitter lowpass filtering by using reconfigurable circuit components such as a plurality of programmable resistors and a plurality of controllable switches. The shared reconfigurable filter 216 may be configured to operate in two operation modes, a RF receiver filtering mode and a RF transmitter filtering mode. The shared reconfigurable filter 216 may be configured so that it may transition between the two operation modes when needed.

In the RF receiver filtering mode, the shared reconfigurable filter 216 may be enabled to receive inbound RF signals received by the antenna 230. The shared reconfigurable filter 216 may be operable to locate desired spectral portions of received inbound RF signals in an upper sideband and/or a lower sideband, respectively. The shared reconfigurable filter 216 may be configured to provide approximately equal power to the ADC 218 for contents located in both the upper sideband and the lower sideband. The outputs of the shared reconfigurable filter 216 may be communicated with the ADC 118 over I path and Q path, respectively.

In the transmitter RF filtering mode, the shared reconfigurable filter 216 may be enabled to suppress intermediate frequency spurs on the outputs of the DAC 222. The LPF 224 may be operable to reduce sideband components in the outputs of the DAC 222. The outputs of the shared reconfigurable filter 216 may be communicated with the mixers 226a and 226b, respectively.

The shared reconfigurable filter 216 is operable to support both a receiver bandpass filtering operation and a transmit lowpass filtering operation. In this regard, the shared reconfigurable filter 216 may be implemented by sharing various circuit components such as, for example, resistors, capacitor, and/or Op-amps, in the transmitter RF filtering mode and the receiver RF filtering mode. The total area on chip occupied by the shared reconfigurable filter 216 may be reduced dramatically by using the shared circuit components in the two operation modes.

In an exemplary operation, referring to FIG. 2, on the RF receiver 210 side, radio signals in RF bands may be received via the antenna 230 and may be communicated the with the LNA 212. The LNA 212 may be enabled to amplify the received radio signals and communicate to the mixers 214a and 214b. The amplified radio signals may be mixed with the pair of downconversion signals ($f_{1a}$, $f_{1b}$) and communicated with the shared reconfigurable filter 216 for a bandpass operation over I path and Q path, respectively. The shared reconfigurable filter 216 may be enabled to operate in a RF receiver filtering mode. The shared reconfigurable filter 216 may be enabled to locate desired spectral portions of the received radio signals into an upper sideband and/or a lower sideband. The outputs of the shared reconfigurable filter 216 may be communicated with the ADC 218. The ADC 218 may be enabled to convert received analog signals from the shared reconfigurable filter 216 to baseband digital data (e.g., bytes) and communicate with the baseband module 240. The baseband module 240 may be enabled extract information conveyed in the received baseband digital data. The extracted information may be utilized for further baseband processing via various exemplary operations such as demodulation, decorrelation, decoding, and error correction.

In another exemplary operation, referring to FIG. 2, on the RF transmitter 220 side, in instances where the baseband module 240 may need to transmit digitized baseband signals in a specific frequency band, the baseband module 240 may communicate the digitized baseband signals with the DAC 222 over I path and Q path, respectively. The DAC 222 may be enabled to convert the received digitized baseband signals to corresponding baseband analog signals and communicate them to the shared reconfigurable filter 216, the latter of which is operable to provide a lowpass filtering function. The shared reconfigurable filter 216 may be enabled to operate in a RF transmitter filtering mode. The shared reconfigurable filter 216 may be enabled to suppress sideband components in the received baseband analog signals and the resulting sideband suppressed signals may be communicated to the mixers 226a and 226b, respectively. The mixers 226a and 226b may be enabled to mix the received baseband analog signals with the pair of upconversion signals ($f_{2a}$, $f_{2b}$) and may communicate with the OP 228. The mixed signals may amplified at the OP 228 and communicate with the antenna 230 for transmission, accordingly.

Figure 3:
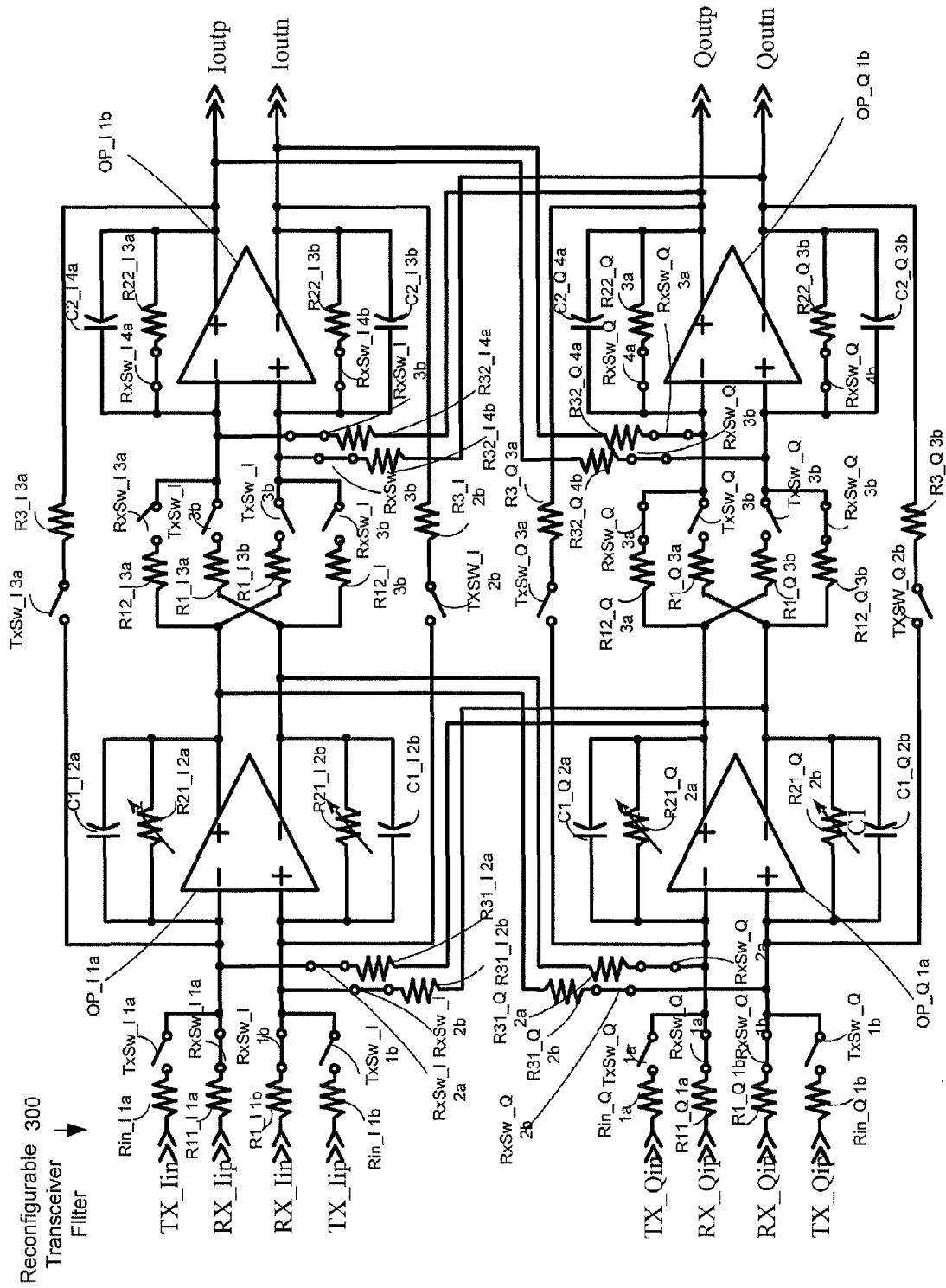
FIG. 3 is a circuit diagram illustrating a reconfigurable filter circuit that is configured for a receive mode of operation, in accordance with an embodiment of the invention.

FIG. 3 is a circuit diagram illustrating an exemplary reconfigurable filter circuit that is configured for a receive mode of operation, in accordance with an embodiment of the invention. Referring to FIG. 3, there is shown a reconfigurable filter 300. The reconfigurable filter 300 may comprise a plurality of switches, a plurality of resistors, a plurality of capacitors, a plurality of amplifiers, a plurality of input signals, and a plurality of output signals.

The plurality of switches may comprise suitable logic, circuitry, and/or code that may be managed to be open or closed. The plurality of switches may comprise switches TxSW_I 1a, ... 3a, TxSW_Q 1a, ... 3a, TxSW_I 1b, ... 3b, TxSW_Q 1b, ... 3b, RxSW_I 1a, ... 4a, RxSW_Q 1a, ... 4a, RxSW_I 1b, ... 4b, RxSW_Q 1b, ... 4b.

The switches TxSW_I 1a, ... 3a, TXSW_Q 1a, ... 3a, TxSW_I 1b, ... 3b, TxSW_Q 1b, ... 3b are collectively referred to herein as switches TxSWs. The switches RxSW_I 1a, ... 4a, RxSW_Q 1a, ... 4a, RxSW_I 1b, ... 4b, RxSW_Q 1b, ... 4b are collectively referred to herein as switches RxSWs.

The status (open/closed) of the TxSWs and RxSWs may be controlled based on corresponding operation mode of the radio transceiver 200. In instances where the TxSWs are open and at the same time the RxSWs are closed as presented in FIG. 2, the reconfigurable filter 300 may be configured to operate in the receiver RF filtering mode.

The plurality of resistors may comprise programmable resistors and a plurality of constant-valued resistors. The programmable resistors may comprise R21_I 2a, R21_I 2b, R21_Q 2a, and R21_Q 2b, which are collectively referred to herein as resistors R_programmable. The values of the resistors R_programmable may be selected based on corresponding operation mode of the radio transceiver 200.

The plurality of on-demand resistors may comprise R11_I 1a,b, R11_Q 1a,b, R31_I 2a,b, R12_I 3a,b, R32_I 4a,b, R22_I,3a,b, R31_Q 2a,b R12_Q 3a,b, R32_Q,4a,b, R22_Q, 3a,b, Rin_I,1a, 1b, R3_I 3a,b, R1_I 3a,b, R3_I, 1b, Rin_Q, 1a, 1b, R3_Q 3a,b, R1_Q 3a,b, and R3_Q, 1b. The plurality of on-demand resistors may be active based on operation mode of the radio transceiver 200. The plurality of on-demand resistors, R11_I 1a,b, R11_Q 1a,b, R31_I 2a,b, R12_I 3a,b, R32_I 4a,b, R22_I,3a,b, R31_Q 2a,b R12_Q 3a,b, R32_Q,4a,b, and R22_Q,3a,b are collectively referred to herein as resistors R_Rx. The resistors R_Rx may be activated in the receiver RF filtering mode. The plurality of on-demand resistors, Rin_I,1a, 1b, R3_I 3a,b, R1_I 3a,b, R3_I, 1b, Rin_Q,1a, 1b, R3_Q 3a,b, R1_Q 3a,b, and R3_Q, 1b are collectively referred to herein as resistors R_Tx. The resistors R_Tx may be activated in the transmitter RF filtering mode.

The plurality of capacitors may comprise capacitors C1_I 2a, ..., C2_I 3b, C1_Q 2a, ..., and C2_Q 3b, which are collectively referred to herein as capacitors C_shared. The plurality of amplifiers may comprise operational amplifiers (OP) OP_I 1a, OP_I 1b, OP_Q 1a, and OP_Q 1b, which are collectively referred to herein as operational amplifiers OP_shared. The capacitors C_shared and the operational amplifiers OP_shared are shared in both the receiver RF filtering mode and the transmitter RF filtering mode. The input signals may comprise I-path input signals and Q-path input signals. The input signals on I-path may comprise RX_Iip and RX_Iin, which are referred to herein as RX_in_I, associated with the receiver RF filtering mode, TX_Iip and TX_Iin, which are referred to herein as TX_in_I, associated with the RF transmitter filtering mode, respectively. The Q-path input signals may comprise RX_Qip and RX_Qin, which are referred to herein as RX_in_Q, associated with the RF receiver filtering mode, TX_Qip and TX_Qin, which are referred to herein as TX_in_Q, associated with the RF transmitter filtering mode, respectively. The plurality of output signals may comprise I-path output signals and Q-path output signals. The output signals on I-path may comprise I_outp and I_outn. The Q-path output signals may comprise Q_outp and Q_outn.

In operation, the reconfigurable filter 300 may be signaled to operate in the receiver RF filtering mode. The reconfigurable filter 300 may be configured to keep switches TxSWs open while the RxSWs stay closed. The plurality of on-demand resistors R_Rx is active while keeping R_Tx inactive. The programmable resistors R_programmable may be adjusted for values such that the reconfigurable filter 300 may perform a RF receiver bandpass filtering function such as an image rejection bandpass filtering function.

Figure 4:
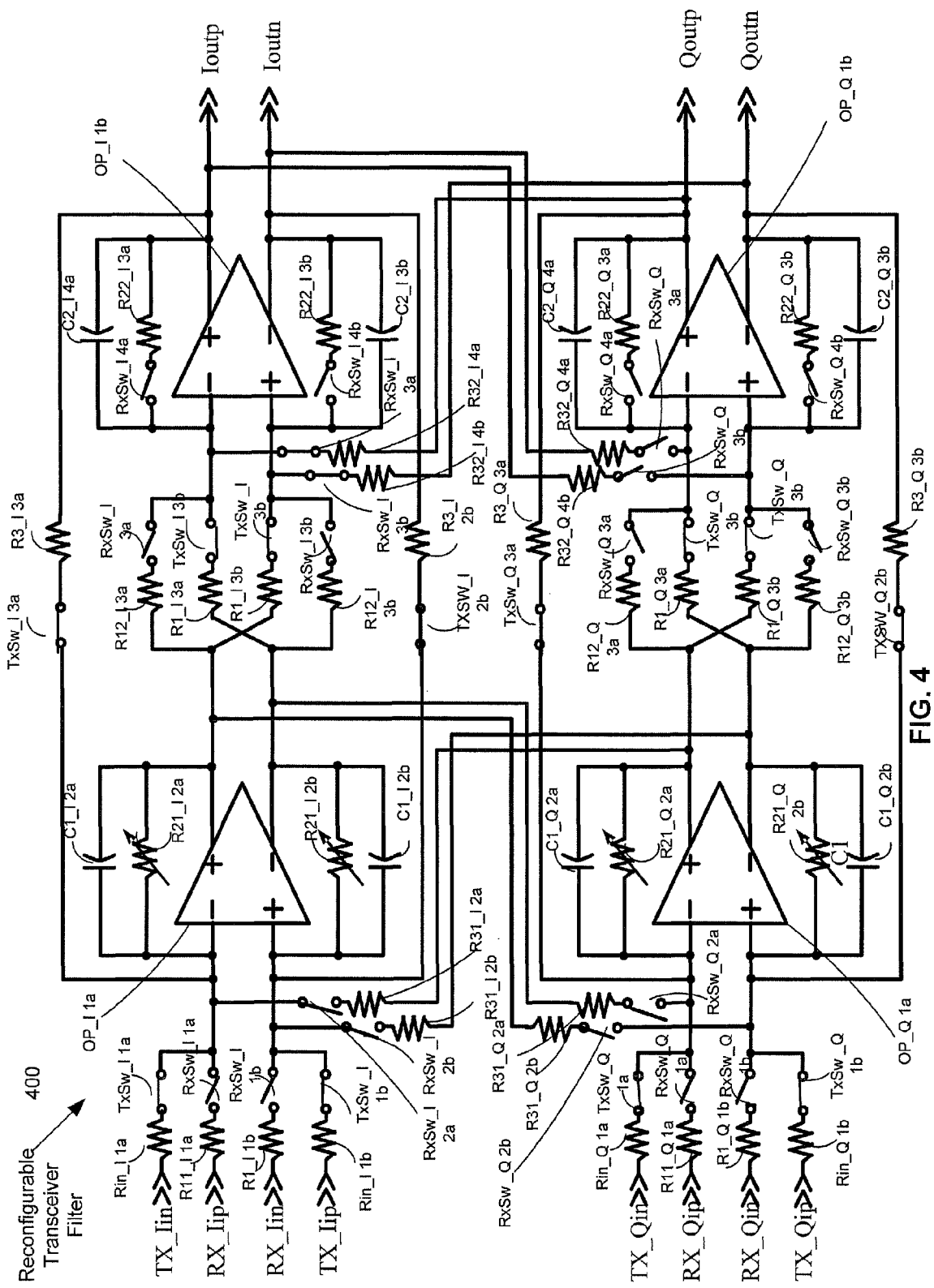
FIG. 4 is a circuit diagram illustrating a reconfigurable filter that is configured for a transmit mode of operation, in accordance with an embodiment of the invention.

FIG. 4 is a circuit diagram illustrating an exemplary reconfigurable filter that is configured for a transmit mode of operation, in accordance with an embodiment of the invention. Referring to FIG. 4, there is shown a reconfigurable filter 400 comprising same circuit components as described with respect to FIG. 3.

The reconfigurable filter 400 may be configured to operate in the transmitter RF filtering mode by keeping the switches TxSWs closed while the RxSWs stay open, simultaneously. The plurality of on-demand resistors R_Rx is inactive while keeping R_Tx active. The reconfigurable filter 400 may perform a lowpass filter by selecting proper values for the programmable resistors R_programmable. In one embodiment of the invention, the programmable resistors may comprise an array of resistors that may be programmed to provide a plurality of different resistance values.

Figure 5:
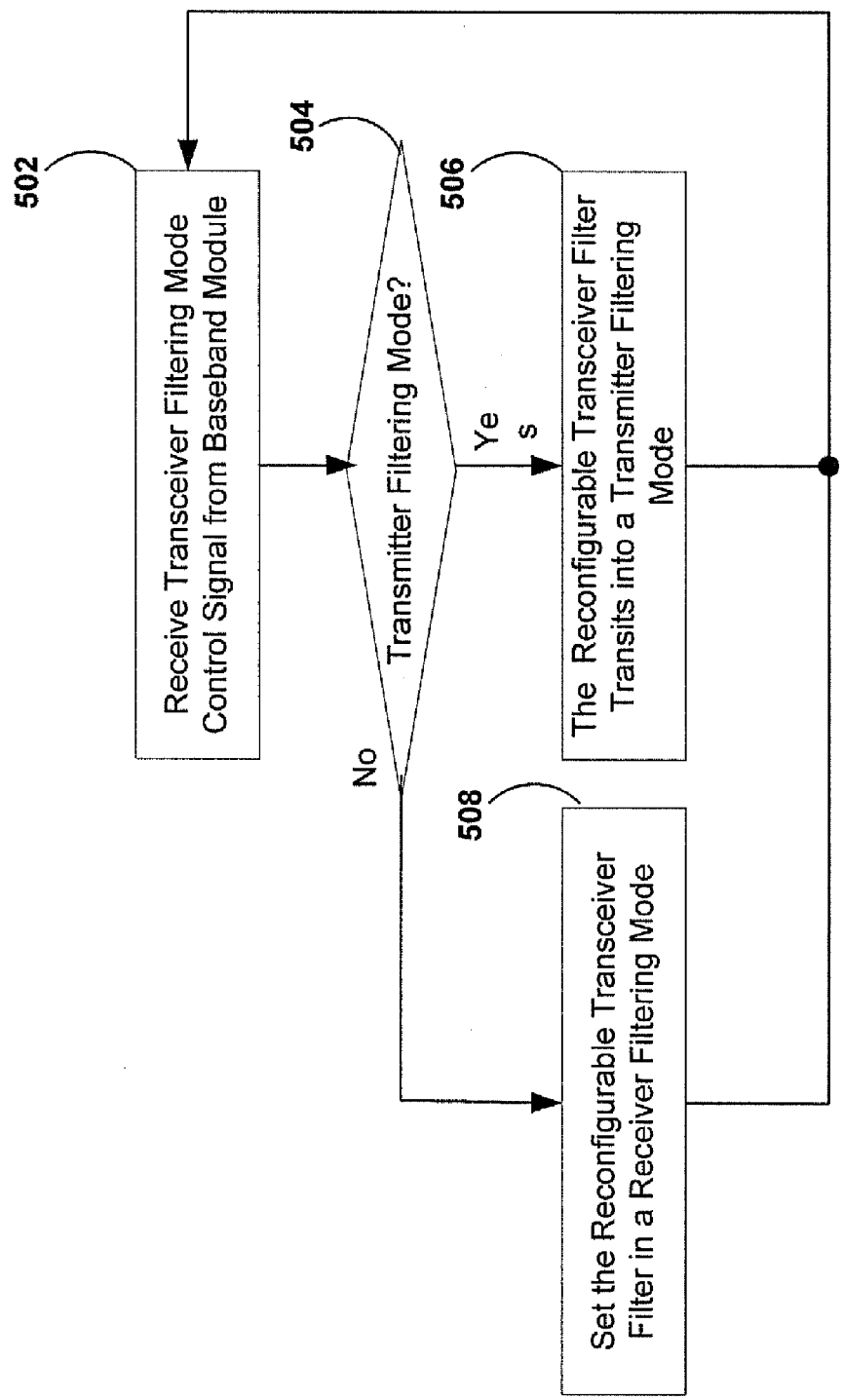
FIG. 5 is a flow chart illustrating an exemplary transceiver mode change that enables receiving and/or transmitting RF signals via a combined receiver poly-phase band pass filter and transmitter low pass filter, in accordance with an embodiment of the invention.

FIG. 5 is a flow chart illustrating an exemplary transceiver mode enables receiving and/or transmitting RF signals via a combined receiver poly-phase band pass filter and transmitter low pass filter, in accordance with an embodiment of the invention. Referring to FIG. 5, the exemplary steps start with the step 502, where the shared reconfigurable filter 216 may be signaled, for example, by receiving a transceiver filtering mode control signal from the baseband module 140, for a transceiver operation mode change. In step 504, the shared reconfigurable filter 216 may determine whether the shared reconfigurable filter 216 may operate in a transmitter RF filtering mode. In instances where the shared reconfigurable filter 216 will operate in the transmitter RF filtering mode, then in step 506, the shared reconfigurable filter 216 may be configured by closing TxSWs, keeping RxSWs open, and programming R_programmable. For example, the value of the R_programmable may be set and/or adjusted depending on a particular transceiver operation mode. The exemplary steps return to the step 502. In step 504, in instances where the shared reconfigurable filter 216 will not operate in the transmitter RF filtering mode, then in step 508, the shared reconfigurable filter 216 may be configured by opening TxSWs, keeping RxSWs closed, and programming R_programmable, for example, by adjusting the value of the R_programmable. The exemplary steps may return to the step 502.

Aspects of a method and system for a reconfigurable radio transceiver filter are provided. In accordance with various embodiments of the invention, the RF receiver 210 and the RF transmitter 220 are integrated on a single substrate. In this regard, the RF receiver 210 and the RF transmitter 220 may be integrated within a single chip. A RF front end of the RF receiver 210 and a RF front end of the RF transmitter 220 may be enabled to share a single filter such as the shared reconfigurable filter 216 to perform a RF receiver filtering operation and a RF transmitter filtering operation. The shared reconfigurable filter 216 may be configured to operate as a bandpass filter such as an image rejection bandpass filter for receiving RF signals by the RF receiver 210. The shared reconfigurable filter 216 may also be configured to operate as a low pass filter for transmitting RF signals by the RF transmitter 220. In this regard, the shared reconfigurable filter 216 may be enabled to operate in a radio frequency receiver filtering mode or a radio frequency transmitter filtering mode, respectively.

The shared reconfigurable filter 216 may be enabled to share configurable circuit components such as active circuit components R21_I 2a and R21_I 2b, which are integrated on the single substrate and/or on a package of the chip comprising said single substrate. The shared reconfigurable filter 216 may be operable to transition between the radio frequency receiver filtering mode and the radio frequency transmitter filtering mode by tuning the shared configurable circuit components. For example, the shared reconfigurable filter 216 may be enabled to perform the radio frequency receiver filtering mode or the radio frequency transmitter filtering mode by adjusting the value of the programmable resistors, R_programmable. In addition, the shared reconfigurable filter 216 may be operable to transition between the radio frequency receiver filtering mode and the radio frequency transmitter filtering mode via activating or deactivating the shared configurable circuit components such as circuit switches TxSWs or RxSWs of the radio transceiver 200.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a reconfigurable filter that is utilized by a RF transmitter and a RF receiver which are integrated on a single substrate.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
in a radio frequency (RF) transmitter and a radio frequency (RF) receiver integrated on a single substrate:
configuring a single filter shared by a RF front end of said RF receiver and a RF front end of said RF transmitter to operate as a bandpass filter for receiving RF signals by said RF receiver; and
configuring said shared single filter to operate as a lowpass filter for transmitting RF signals from said RF transmitter.

2. The method according to claim 1, wherein: said single filter operates as said bandpass filter in a radio frequency receiver filtering mode or operates as said lowpass filter in a radio frequency transmitter filtering mode.

3. The method according to claim 2, wherein said configuring a single filter to operate as a bandpass filter comprises configuring said single filter to operate as an image rejection bandpass filter in said radio frequency receiver filtering mode.

4. The method according to claim 2, wherein said single filter shares configurable circuit components integrated on said single substrate, and/or on a package bonded to said single substrate, when operating in said radio frequency receiver filtering mode and said radio frequency transmitter filtering mode.

5. The method according to claim 4, comprising configuring said single filter to transition between said radio frequency receiver filtering mode and said radio frequency transmitter filtering mode by tuning one or more of said shared configurable circuit components.

6. The method according to claim 4, comprising configuring said single filter to transition between said radio frequency receiver filtering mode and said radio frequency transmitter filtering mode by activating at least a portion of said shared configurable circuit components.

7. The method according to claim 4, comprising configuring said single filter to transition between said radio frequency receiver filtering mode and said radio frequency transmitter filtering mode by deactivating at least a portion of said shared configurable circuit components.

8. The method according to claim 4, comprising transitioning said single filter between said radio frequency receiver filtering mode and said radio frequency transmitter filtering mode via deactivating at least a portion of said shared configurable circuit components.

9. The method according to claim 4, wherein said shared configurable circuit components comprises one or more configured switches, one or more capacitors, one or more resistors and one or more configurable operational amplifiers (OP-AMPS).

10. The method according to claim 1, comprising programming one or more resistors to configure said shared single filter to operate as said lowpass filter for transmitting RF signals from said RF transmitter.

11. A system for communication, the system comprising:
one or more circuits for use in a communication device, said one or more circuits comprising a radio frequency (RF) transmitter, a radio frequency (RF) receiver, and a single filter that is shared by a RF front end of said RF receiver and a RF front end of said RF transmitter, wherein:
said one or more circuits are integrated on a single substrate; and
said one or more circuits are operable to:
configure said single shared filter to operate as a bandpass filter for receiving RF signals by said RF receiver; and
configure said shared single filter to operate as a lowpass filter for transmitting RF signals from said RF transmitter.

12. The system according to claim 11, wherein said single filter operates as said bandpass filter in a radio frequency receiver filtering mode or operates as said lowpass filter in a radio frequency transmitter filtering mode.

13. The system according to claim 12, wherein said one or more circuits are operable to configure said single filter to operate as an image rejection bandpass filter in said radio frequency receiver filtering mode.

14. The system according to claim 12, wherein said single filter shares configurable circuit components on said single substrate, and/or on a package bonded to said single substrate, when operating in said radio frequency receiver filtering mode and said radio frequency transmitter filtering mode.

15. The system according to claim 14, wherein said one or more circuits are operable to configure said single filter to transition between said radio frequency receiver filtering mode and said radio frequency transmitter filtering mode by tuning one or more of said shared configurable circuit components.

16. The system according to claim 14, wherein said one or more circuits are operable to configure said single filter to transition between said radio frequency receiver filtering mode and said radio frequency transmitter filtering mode by activating at least a portion of said shared configurable circuit components.

17. The system according to claim 14, wherein said one or more circuits are operable to configure said single filter to transition between said radio frequency receiver filtering mode and said radio frequency transmitter filtering mode by deactivating at least a portion of said shared configurable circuit components.

18. The system according to claim 14, wherein said one or more circuits are operable to configure said single filter to transition between said radio frequency receiver filtering mode and said radio frequency transmitter filtering mode via deactivating at least a portion of said shared configurable circuit components.

19. The system according to claim 14, wherein said shared configurable circuit components comprises one or more configured switches, one or more capacitors, one or more resistors and/or one or more configurable operational amplifiers (OPAMPS).

20. The system according to claim 11, wherein said one or more circuits are operable to program said one or more resistors to configure said shared single filter to operate as said lowpass filter for transmitting RF signals from said RF transmitter.

21. The system according to claim 11, wherein said single filter utilizes a single output for said bandpass filter and said lowpass filter.

* * * * *